United States Patent [19]

Abdi et al.

[11] Patent Number: 5,180,935

[45] Date of Patent: Jan. 19, 1993

[54] DIGITAL TIMING DISCRIMINATOR

[75] Inventors: Behrooz Abdi, Chandler; Gary Stuhlmiller, Mesa, both of Ariz.

[73] Assignee: Motorola, Inc., Schaumburg, Ill.

[21] Appl. No.: 821,290

[22] Filed: Jan. 10, 1992

Related U.S. Application Data

[63] Continuation of Ser. No. 610,876, Nov. 9, 1990, abandoned.

[51] Int. Cl.⁵ .......................... H03K 9/06; H03D 3/02
[52] U.S. Cl. .................................... 307/524; 307/526; 307/528; 328/134; 328/141; 377/39
[58] Field of Search ................. 307/522-528; 328/133, 134, 140, 141; 377/44, 39, 47, 101, 28, 107

[56] References Cited

U.S. PATENT DOCUMENTS

| | | | |
|---|---|---|---|
| 3,895,293 | 7/1975 | Munz | 307/528 |
| 3,924,183 | 12/1975 | Fletcher et al. | 328/134 |
| 4,084,127 | 4/1978 | Tults | 328/134 |
| 4,123,704 | 10/1978 | Johnson | 328/134 |
| 4,276,468 | 6/1981 | Nagamoto et al. | 377/39 |
| 4,341,995 | 7/1982 | Hennick | 328/134 |
| 4,360,782 | 11/1982 | Nowell | 307/523 |
| 4,566,111 | 1/1986 | Tanagawa | 377/28 |
| 4,737,984 | 4/1988 | Brown | 377/39 |
| 4,801,894 | 1/1989 | Garner | 328/134 |
| 4,941,161 | 7/1990 | Cook | 377/28 |

Primary Examiner—Timothy P. Callahan
Attorney, Agent, or Firm—Robert D. Atkins

[57] ABSTRACT

A frequency discriminator circuit is provided having increased resolution for detecting the frequency of a data input signal above and below a predetermined frequency threshold by monitoring a count value. The output signal of the frequency discriminator circuit remains at a first logic state provided the count value is reset by the data input signal before reaching a predetermined count value signifying that the frequency of data input signal is above the predetermined frequency threshold. The output signal of the frequency discriminator circuit switches to a second logic state if the count value reaches the predetermined count value before receiving a reset signal thereby indicating that the frequency of data input signal is below the predetermined frequency threshold.

5 Claims, 2 Drawing Sheets

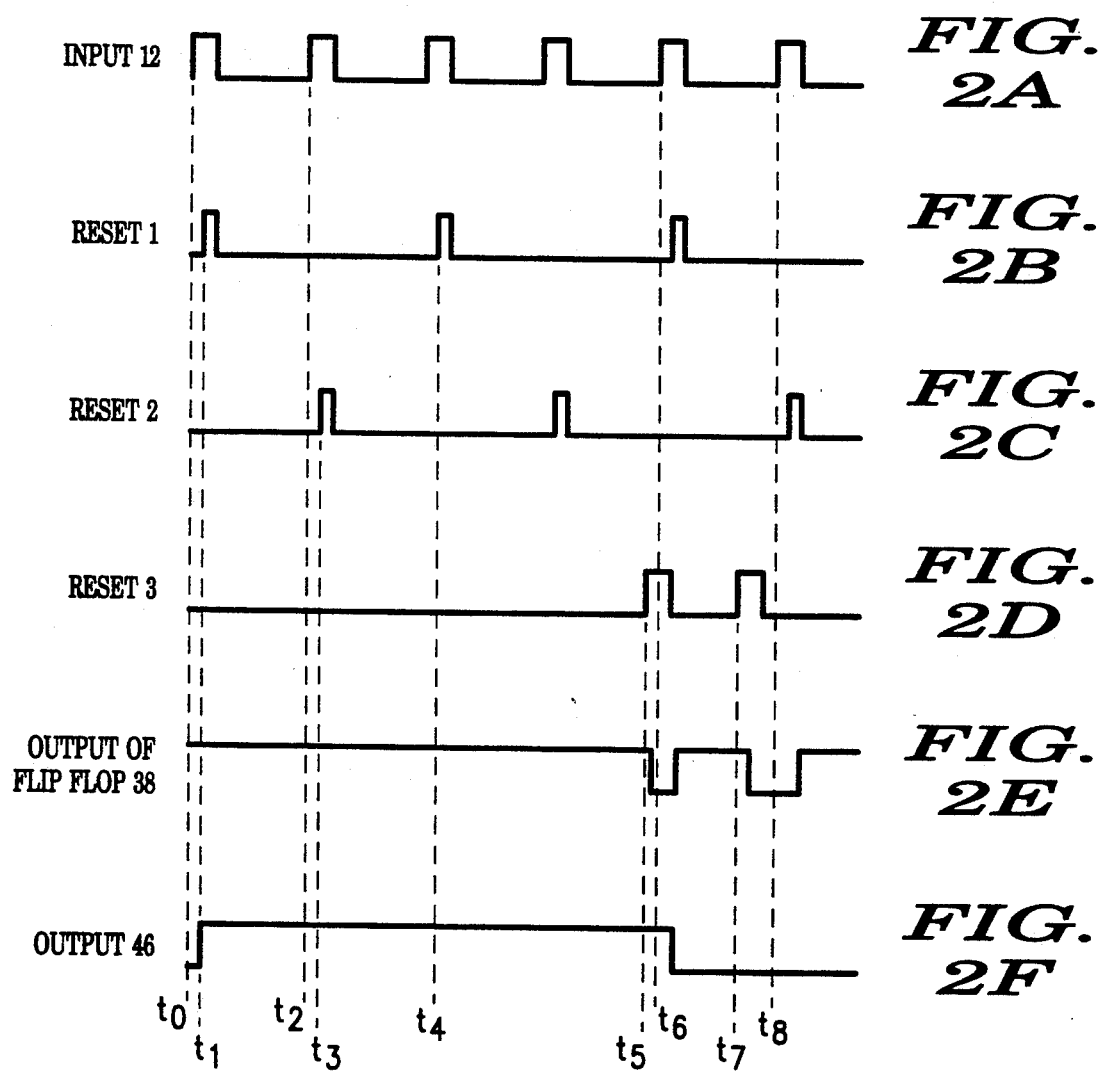

DIGITAL TIMING DISCRIMINATOR

This application is a continuation of prior application Ser. No. 07/610,876, filed Nov. 9, 1990 now abandoned.

FIELD OF THE INVENTION

This invention relates in general to digital timing discriminators for distinguishing the frequency of a data input signal above or below a predetermined threshold with increased frequency detection resolution.

BACKGROUND OF THE INVENTION

Frequency discriminator circuits are used in a myriad of applications wherein it is necessary to distinguish the frequency of a data input signal about a predetermined threshold. For example in an application involving the control of the servo mechanism of a magnetic disk drive, the frequency of the data input signal must be differentiated either above or below the threshold a reference frequency. A common prior art technique for frequency discrimination uses a D-type flipflop in combination with a timing capacitor and comparator for monitoring the voltage across the timing capacitor against a reference potential. The output of the comparator is coupled to the data input of a second D-type flipflop while the data input signal is applied at the clock input of the same for providing an output signal to indicate whether the frequency of the input signal is above or below a predetermined threshold. A logic one is applied at the data input of the D-type flipflop, while the data input signal is applied at the clock input of the same. The output signal of the D-type flipflop is applied back to the reset input yielding narrow pulses at its Q-output. The narrow pulses charge the timing capacitor while a current source continuously discharges the same. The triangular voltage waveform developed across the timing capacitor is compared to the reference potential for providing a high output signal if the voltage across the timing capacitor is greater than the reference potential and a low output signal when the timing capacitor voltage is less than the reference potential.

If the frequency of the data input signal is greater than the predetermined threshold, the narrow pulses appearing at the Q-output of the D-type flipflop circuit repeat at a sufficiently rapid rate to maintain the voltage across the timing capacitor above the reference potential and keep the output signal high. Otherwise if the frequency of the data input signal is low, the longer intervals between the output pulses of the D-type flipflop allows the current source to discharge the timing capacitor below the reference potential. The output signal of the frequency discriminator circuit drops to logic zero indicating that the frequency of the data input signal is below the predetermined threshold as determined by several analog control parameters including the value of the capacitor, the magnitude of current flowing through the current source and the reference potential.

Unfortunately, the timing capacitor and current source are temperature dependent devices and subject to manufacturing process variation, while the reference potential often contains external noise. A steady operating point is difficult to maintain for the predetermined frequency threshold as the aforedescribed variations in the analog control parameters limit the accuracy thereof and thus the resolution of the frequency discriminator circuit. This is especially true when attempting to track the data input signal over a range of frequencies. It is desirable to eliminate the analog components such as the timing capacitor, current source and external reference potential.

Hence, there is a need for an improved frequency discriminator circuit having greater accuracy in distinguishing the frequency of the data input signal about a predetermined threshold.

SUMMARY OF THE INVENTION

Briefly stated, the invention comprises a frequency discriminator circuit having a first circuit coupled for receiving a data input signal and providing first and second reset signals at first and second outputs respectively in response to the data input signal. A first counter includes a clock input coupled for receiving a reference clock signal for counting a first count value and a reset input coupled for receiving the first reset signal for resetting the first count value to a predetermined initial value. A second counter includes a clock input coupled for receiving the reference clock signal for counting a second count value while the reset input receives the second reset signal for resetting the second count value to a predetermined initial value. A second circuit monitors the first and second count values and provides first and second output signals. The first output signal has a first state when the first count value is reset before reaching a predetermined count threshold and a second state when the first count value reaches the predetermined count threshold. The second output signal has a first state when the second count value is reset before reaching the predetermined count threshold and a second state when the second count value reaches the predetermined count threshold.

In another aspect the present invention is a method of discriminating the frequency of a data input signal about a predetermined frequency threshold comprising the steps of generating first and second reset signals in response to the data input signal, counting a first count value with a reference clock signal and resetting the first count value to a predetermined initial value in response to the first reset signal, counting a second count value with the reference clock signal and resetting the second count value to a predetermined initial value in response to the second reset signal, and monitoring the first and second count values and providing an output signal having a first state when the first or second count value is reset before reaching a predetermined count value indicating the data input signal is above the predetermined frequency threshold. The output signal has a second state when the first or second count value reaches the predetermined count value indicating the data input signal is below the predetermined frequency threshold.

The frequency discriminator circuit has increased resolution for detecting the frequency of a data input signal about a predetermined frequency threshold by monitoring a count value, wherein the output signal of the frequency discriminator circuit remains at a first logic state provided the count value is reset by the data input signal before reaching a predetermined count value signifying that the frequency of the data input signal is above the predetermined frequency threshold. The output signal of the frequency discriminator circuit switches to a second logic state if the count value reaches the predetermined count value before receiving a reset signal thereby indicating that the frequency of data input signal is below the predetermined frequency threshold.

BRIEF DESCRIPTION OF THE DRAWING

FIGS. 2A-2F are timing diagrams useful in the explanation of the present invention.

DETAILED DESCRIPTION OF THE PREFERRED EMBODIMENT

Figure 1:
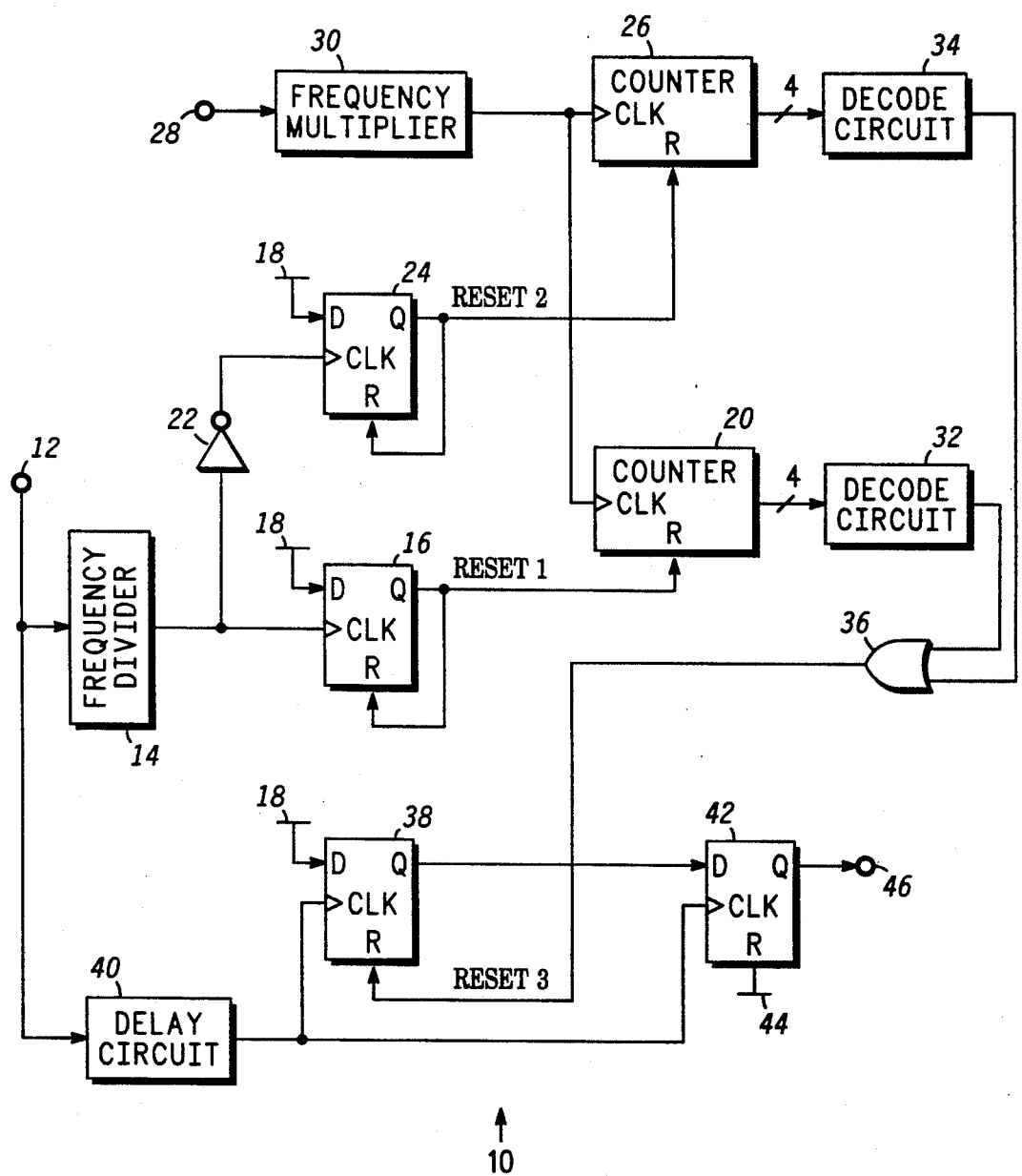
FIG. 1 is a schematic and block diagram illustrating the preferred embodiment of the present invention.

Referring to FIG. 1, there is shown frequency discriminator circuit 10 suitable for manufacturing in integrated circuit form using conventional integrated circuit processing techniques. A data input signal is applied at input 12 through frequency divider circuit 14 to the clock input of D-type flipflop 16. The data input of D-type flipflop 16 receives a logic one from power supply conductor 18, typically operating at a positive potential such as $V_{DD}$. The Q-output of D-type flipflop 16 provides a RESET1 signal at the reset input of the same and further at the reset input of counter 20. The output signal of frequency divider circuit 14 is also applied through inverter 22 to the clock input of D-type flipflop 24, while the data input of D-type flipflop 24 is coupled for receiving a logic one from power supply conductor 18. The Q-output of D-type flipflop 24 provides a RESET2 signal at the reset input thereof and at the reset input of counter 26. A reference signal having a predetermined frequency of say 20 megahertz is applied at input 28 and frequency doubled through frequency multiplier circuit 30 for application to the clock input of counters 20 and 26. The 4-bit count values of counters 20 and 26 are decoded through decode circuits 32 and 34, respectively, and applied at the first and second inputs of OR gate 36, the output of which generates a RESET3 signal at the reset input of D-type flipflop 38. The data input signal applied at input 12 is also coupled through delay circuit 40 to the clock inputs of D-type flipflops 38 and 42, while the data input of D-type flipflop 38 receives a logic one from power supply conductor 18. Delay circuit 40 may comprise a series of inverters for delaying the data input signal with respect to RESET3 signal. The Q-output of D-type flipflop 38 is coupled to the data input of D-type flipflop 42, and the reset input of D-type flipflop 42 is coupled for receiving a logic zero from power supply conductor 44, typically operating at $V_{EE}$ such as ground potential. Output 46 is provided at the Q-output of D-type flipflop 42.

The primary operation of frequency discriminator circuit 10 is to provide a logic one output signal at output 46 if the frequency of the data input signal is greater than a predetermined frequency threshold as determined by the frequency of the reference signal and a predetermined count value recognized by decode circuits 32 and 34. The output signal at output 46 is logic zero when the frequency of the data input signal becomes less than the frequency threshold. Accordingly, the 20 MHz reference signal applied at input 28 is doubled to 40 Mhz through frequency multiplier circuit 30 and applied at the clock input of 4-bit counters 20 and 26 incrementing the values thereof at the rising edge of the reference signal until reset to zero by RESET1 signal and RESET2 signal, respectively. The frequency of the reference signal should be selectable and matched to width of counters 20 and 26 for the anticipated frequency operating range of the data input signal.

While the reference signal is busily incrementing counters 20 and 26, the data input signal is applied through input 12 to frequency divider circuit 14 which cuts the frequency thereof in half for providing a symmetry waveform at the clock inputs of D-type flipflops 16 and 24 thereby reducing the effects of timing jitter and pairing common in communication systems. This feature is helpful should two or more adjacent periods of the data input signal have unequal duty cycles although not essential to the fundamental operation of frequency discriminator circuit 10.

Turning to FIG. 2, a series of waveform plots are illustrated which are useful in the explanation of the present invention. The data input signal as shown in FIG. 2A may be asynchronous with respect to the reference signal. One phase of the output signal of frequency divider circuit 14 is applied at the clock input of D-type flipflop 16, while the opposite phase provided at the output of inverter 22 is applied at the clock input of D-type flipflop 24 for generating RESET1 and RESET2 pulses as shown in FIGS. 2B and 2C operating at one half the frequency of the data input signal. For example, the rising edge of the data input signal at time $t_0$ of FIG. 2A may correspond to the rising edge of the output signal of frequency divider circuit 14 producing a clock signal for D-type flipflop 16 and propagating the logic one applied at the data input thereof to the Q-output thereby producing a logic one for RESET1 signal as shown at time $t_1$ of FIG. 2B. The RESET1 signal immediately resets D-type flipflop 16, although not before producing a short pulse equal to the time delay through D-type flipflop 16 of sufficient duration to reset counter 20. It is understood that one or more inverters (not shown) may be serially coupled between the Q-output and reset input of D-type flipflops 16 and 24 for providing the necessary pulse width of RESET1 and RESET2 to zeroize counters 20 and 26. However, the pulse width of RESET1 and RESET2 should be less than the period of the data input signal to avoid missing clock signals for D-type flipflops 16 and 24. The next rising edge of the data input signal at time $t_2$ produces a falling edge at the output of frequency divider circuit 14 and a rising edge at the clock input of D-type flipflop 24, thereby transferring the logic one applied at the D-input to the Q-output thereof and developing a RESET2 pulse at time $t_3$ as shown in FIG. 2C. The RESET2 signal zeroizes counter 26 and resets D-type flipflop 24 to logic zero.

The values of counters 20 and 26 are applied at the inputs of decode circuits 32 and 34, respectfully, for detecting the occurrence of a predetermined 4-bit count value, for example, "1100". Decode circuits 32 and 34 may each comprise a 4-input AND gate (not shown) with inverters coupled between the two least significant bits of counters 20 and 26 and the corresponding inputs of the AND gates. A count value of "1100" thus appears as a "1111" at inputs of the AND gate causing the output thereof to transition to a logic one. Any count value other than "1100" will apply one or more logic zeros to the inputs of the AND gate producing an output logic zero. Decode circuits 32 and 34 may also contain programmable combinational logic for decoding selectable count values as is understood. An alternate technique for counters 20 and 26 involves loading a predetermined count value like "1100" and decrementing the count until reaching a minimum value like "0000" before activating the RESET3 signal.

Between times $t_0$ and $t_4$, the frequency of the data input signal is above the predetermined threshold whereby RESET1 and RESET2 signals manage to reset counter 20 and 26 before reaching the count value "1100". Decode circuits 32 and 34 each provide logic zeroes at the first and second inputs of OR gate 36 yielding a logic zero for the RESET3 signal as shown in FIG. 2D. The data input signal delayed through delay circuit 40 and applied at the clock inputs of D-type flipflops 38 and 42 transfers the logic one from the Q-output of the former to the Q-output of the latter at output 46, see FIGS. 2E and 2F. Thus, output 46 remains at logic one while the frequency of the data input signal is greater than the predetermined frequency threshold.

Now consider a lower frequency for the data input signal beginning at time $t_4$ of FIG. 2. The RESET1 and RESET2 signals spread out with the longer period of the data input signal allowing more time for the reference signal to increment counters 20 and 26 before actuating RESET1 and RESET2 signals. Indeed, the next RESET1 signal after time $t_4$ does not occur in time to reset counter 20 before reaching count value "1100". The output signal of decode circuit 32 becomes logic one at time $t_5$ resetting the Q-output of D-type flipflop 38 to logic zero. The next rising edge of the data input signal at time $t_6$ after propagating through delay circuit 40 transfers the logic zero through D-type flipflop 42 to output 46 as shown in FIG. 2F. The RESET3 signal returns to logic zero as the RESET1 pulse zeroizes counter 20, or as counter 20 increments to the next value, releasing the reset input of D-type flipflop 38. The lower frequency of the data input signal also extends the time between pulses of the RESET2 signal allowing counter 26 to reach value "1100" again activating RESET3 and resetting D-type flipflop 38 at time $t_7$. The Q-output of D-type flipflop 38 remains logic zero until the rising edge of the data input signal at time $t_8$ clocks another logic zero to output 46. The late deliveries of the RESET1 and RESET2 signal cause the output signals of decode circuits 32 and 34 to keep resetting D-type flipflop 38. Thus, output 46 remains logic zero while the frequency of the data input signal is less than the predetermined frequency threshold.

It is possible to simplify frequency discriminator circuit 10 with the elimination of frequency divider circuit 14, D-type flipflops 16 and 24, counter 20, decode circuit 32 and OR gate 36 by applying the data input signal directly to the reset input of counter 26. Such a configuration would simplify the components of frequency discriminator circuit 10 circuit at the expense of resolution and accuracy since the duty cycle of adjacent periods of the data input signal may not be symmetrical. Alternately, it is possible to increase the resolution by dividing the data input signal by say four and applying one phase to each of four D-type flipflops like 16 and 24 for controlling the reset inputs of four counters like 20 and 26. Additional decode circuits would monitor the value of each counter for detecting one or more counters exceeding the predetermined count value. The combination of four D-type flipflops and counters would detect the drop in frequency of the data input signal sooner thereby provide greater resolution for frequency discriminator circuit 10. In general, the resolution increases with the number of counters like 20 and 26 and D-type flipflops like 16 and 24. The frequency detection resolution may also be increased by widening counters 20 and 26 for higher count values and increasing the frequency of the reference signal.

Hence, what has been provided is a novel frequency discriminator circuit having increased resolution for detecting the frequency of a data input signal about a predetermined frequency threshold by monitoring a count value, wherein the output signal of the frequency discriminator circuit remains at a first logic state provided the count value is reset by the data input signal before reaching a predetermined count value signifying that the frequency of the data input signal is above the predetermined frequency threshold. The output signal of the frequency discriminator circuit switches to a second logic state if the count value reaches the predetermined count value before receiving a reset signal thereby indicating that the frequency of data input signal is below the predetermined frequency threshold.

We claim:

1. An integrated frequency discriminator circuit for detecting the frequency of a data input signal about a predetermined frequency threshold, comprising:

a first flipflop circuit having a data input, a clock input, a reset input and an output, said data input being coupled for receiving a first logic signal, said clock input being coupled for receiving the data input signal, said output being coupled to said reset input of said first flipflop circuit for providing a first reset signal;

a first counter having a clock input, a reset input and an output, said clock input being coupled for receiving a reference signal for adjusting a first count value, said reset input being coupled for receiving said first reset signal for resetting said first count value;

a first decode circuit having an input coupled to said output of said first counter and having an output for providing an output signal having said first state while said first count value is equal to a predetermined count threshold and a second state when said first count value is not equal to said predetermined count threshold;

a second flipflop circuit having a data input, a clock input, a reset input and an output, said data input being coupled for receiving said first logic signal, said clock input being coupled for receiving the data input signal, said reset input being coupled for receiving said output signal of said first decode circuit; and a third flipflop circuit having a data input, a clock input and an output, said data input being coupled to said output of said second flipflop circuit, said clock input being coupled for receiving the data input signal, said output providing an output signal having said first state when said first count value is reset before reaching said predetermined count threshold and having said second state when said first count value reaches said predetermined count threshold.

2. The integrated frequency discriminator circuit of claim 1 further comprising:

a frequency divider circuit having an input coupled for receiving the data input signal and having an output coupled to said clock input of said first flipflop circuit;

an inverter circuit having an input coupled to said output of frequency divider circuit and having an output; and a fourth flipflop circuit having a data input, a clock input, a reset input and an output, said data input being coupled for receiving said first logic signal, said clock input being coupled to said output of said inverter circuit, said output being coupled to said reset input of said fourth flipflop circuit for providing a second reset signal.

3. The integrated frequency discriminator circuit of claim 2 further comprising:
   a second counter having a clock input, a reset input and an output, said clock input being coupled for receiving said reference signal, said reset input being coupled for receiving said second reset signal;
   a second decode circuit having an input coupled to said output of said second counter and having an output; and
   a logic circuit having first and second inputs and an output, said first input being coupled to said output of said first decode circuit for providing an output signal at the occurrence of said first state of said output signal from said first decode circuit, said second input being coupled to said output of said second decode circuit for providing an output signal at the occurrence of said first state of said output signal from said second decode circuit, said output being coupled to said reset input of said second flipflop circuit.

4. A circuit, comprising:
   first means coupled for receiving a data input signal and providing first and second reset signals at first and second outputs respectively in response to said data input signal, said first and second reset signals having a predetermined phase relationship, said first means including,
   (a) a frequency divider circuit having an input coupled for receiving said data input signal and having an output,
   (b) a first flipflop circuit having a data input, a clock input, a reset input and an output, said data input being coupled for receiving a first logic signal, said clock input being coupled to said output of said frequency divider circuit, said output being coupled to said reset input of said first flipflop circuit for providing said first reset signal of said first means,
   (c) an inverter circuit having an input coupled to said output of frequency divider circuit and having an output, and
   (d) a second flipflop circuit having a data input, a clock input, a reset input and an output, said data input being coupled for receiving said first logic signal, said clock input being coupled to said output of said inverter circuit, said output being coupled to said reset input of said second flipflop circuit for providing said second reset signal of said first means;
   a first counter having a clock input, a reset input and an output, said clock input being coupled for receiving a reference clock signal for counting a first count value, said reset input receiving said first reset signal for resetting said first count value to a predetermined initial value;
   a second counter having a clock input, a reset input and an output, said clock input being coupled for receiving said reference clock signal for counting a second count value, said reset input receiving said second reset signal for resetting said second count value to a predetermined initial value;
   a first decode circuit having an input coupled to said output of said first counter and having an output for providing a first output signal having a first state when said first count value is equal to a predetermined count threshold and a second state when said first count value is not equal to said predetermined count threshold;
   a second decode circuit having an input coupled to said output of said second counter and having an output for providing a second output signal having a first state when said second count value is equal to said predetermined count threshold and a second state when said second count value is not equal to said predetermined count threshold; and
   a logic circuit having first and second inputs and an output, said first input being coupled to said output of said first decode circuit for providing an output signal at the occurrence of said first state of said first output signal from said first decode circuit, said second input being coupled to said output of said second decode circuit for providing an output signal at the occurrence of said first state of said second output signal from said second decode circuit.

5. A circuit, comprising:
   first means coupled for receiving a data input signal and providing first and second reset signals at first and second outputs respectively in response to said data input signal, said first and second reset signals having a predetermined phase relationship;
   a first counter having a clock input, a reset input and an output, said clock input being coupled for receiving a reference clock signal for counting a first count value, said reset input receiving said first reset signal for resetting said first count value to a predetermined initial value;
   a second counter having a clock input, a reset input and an output, said clock input being coupled for receiving said reference clock signal for counting a second count value, said reset input receiving said second reset signal for resetting said second count value to a predetermined initial value;
   a first decode circuit having an input coupled to said output of said first counter and having an output for providing a first output signal having a first state when said first count value is equal to a predetermined count threshold and a second state when said first count value is not equal to said predetermined count threshold;
   a second decode circuit having an input coupled to said output of said second counter and having an output for providing a second output signal having a first state when said second count value is equal to said predetermined count threshold and a second state when said second count value is not equal to said predetermined count threshold;
   a logic circuit having first and second inputs and an output, said first input being coupled to said output of said first decode circuit for providing an output signal at the occurrence of said first state of said first output signal from said first decode circuit, said second input being coupled to said output of said second decode circuit for providing an output signal at the occurrence of said first state of said second output signal from said second decode circuit;

a delay circuit having an input coupled for receiving said data input signal and having an output;

a third flipflop circuit having a data input, a clock input, a reset input and an output, said data input being coupled for receiving said first-logic signal, said clock input being coupled to said output of said delay circuit, said reset input being coupled to said output of said logic circuit; and a fourth flipflop circuit having a data input, a clock input and an output, said data input being coupled to said output of said third flipflop circuit, said clock input being coupled to said output of said delay circuit, said output providing an output signal of the circuit having a first state when said first and second count values are reset before reaching said predetermined count threshold and having a second state when said first or second count value reaches said predetermined count threshold.

* * * * *